(12) United States Patent
Ishii

(10) Patent No.: US 8,669,479 B2
(45) Date of Patent: Mar. 11, 2014

(54) WIRED CIRCUIT BOARD

(71) Applicant: Nitto Denko Corporation, Osaka (JP)

(72) Inventor: Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/681,961

(22) Filed: Nov. 20, 2012

(65) Prior Publication Data

US 2013/0133939 A1    May 30, 2013

Related U.S. Application Data

(60) Provisional application No. 61/630,275, filed on Dec. 8, 2011.

(30) Foreign Application Priority Data

Nov. 28, 2011    (JP) ................................. 2011-258865

(51) Int. Cl.
*H05K 1/11* (2006.01)
*H05K 1/09* (2006.01)

(52) U.S. Cl.
USPC ........................... 174/262; 174/257; 361/767

(58) Field of Classification Search
CPC .................. H05K 1/111–1/113; H05K 1/115; H05K 2201/096
USPC .......... 174/250, 257, 260–262; 361/760, 767, 361/768, 777

See application file for complete search history.

(56) References Cited

U.S. PATENT DOCUMENTS

| | | | |
|---|---|---|---|
| 2005/0122627 A1* | 6/2005 | Kanagawa et al. | 360/245.9 |
| 2006/0087011 A1* | 4/2006 | Kanagawa et al. | 257/676 |
| 2009/0190263 A1* | 7/2009 | Miura et al. | 360/245.8 |
| 2010/0067151 A1 | 3/2010 | Okawara et al. | |
| 2010/0073825 A1 | 3/2010 | Okawara | |
| 2010/0177445 A1 | 7/2010 | Fuchino | |
| 2012/0014017 A1 | 1/2012 | Ohnuki et al. | |
| 2012/0224282 A1* | 9/2012 | Hanya et al. | 360/244.2 |

FOREIGN PATENT DOCUMENTS

| | | |
|---|---|---|
| JP | 2010-079944 A | 4/2010 |
| JP | 2010-086649 A | 4/2010 |
| JP | 2010-165406 A | 7/2010 |
| JP | 2012-022756 A | 2/2012 |

* cited by examiner

*Primary Examiner* — Hoa C Nguyen
(74) *Attorney, Agent, or Firm* — Jean C. Edwards; Edwards Neils PLLC

(57) ABSTRACT

A wired circuit board includes an insulating layer formed with a first opening and a second opening, a conductive layer formed on the insulating layer and including a terminal overlapping the first opening, and a wire having a part thereof overlapping the second opening and continued to the terminal, a metal pedestal portion formed under the insulating layer and disposed around the first opening so as to overlap the second opening and support an electronic element, and a conductive portion filling the second opening to provide electrical conduction between the wire and the metal pedestal portion.

4 Claims, 12 Drawing Sheets

FIG.11
(a)
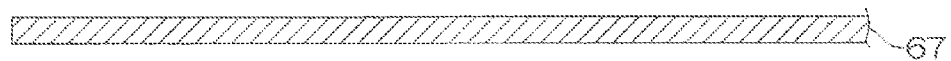
(b)
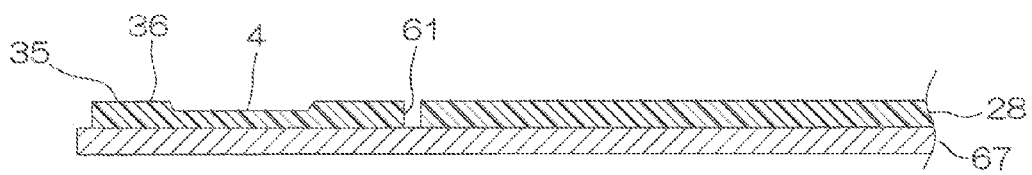
(c)
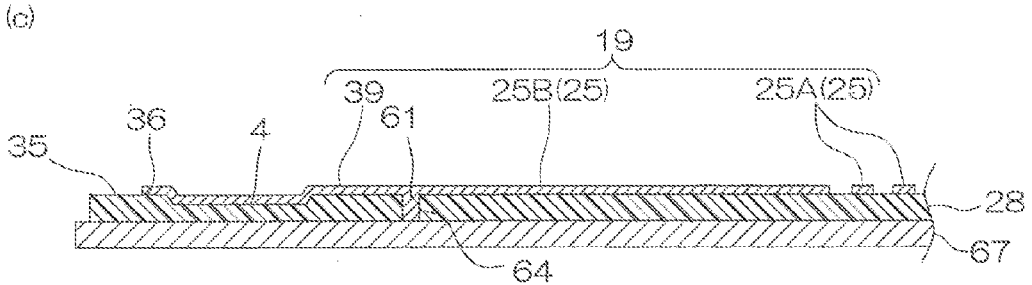
(d)
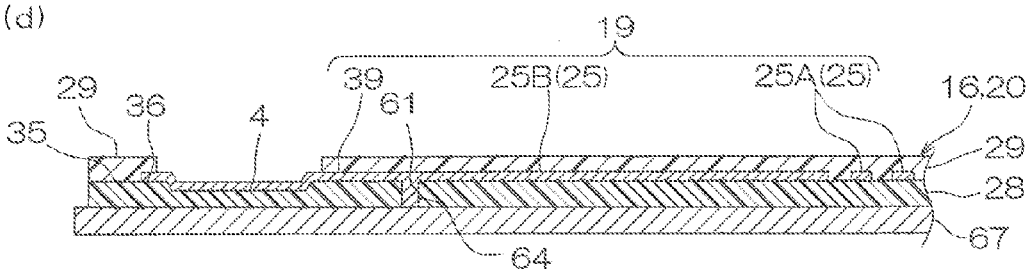

FIG.12
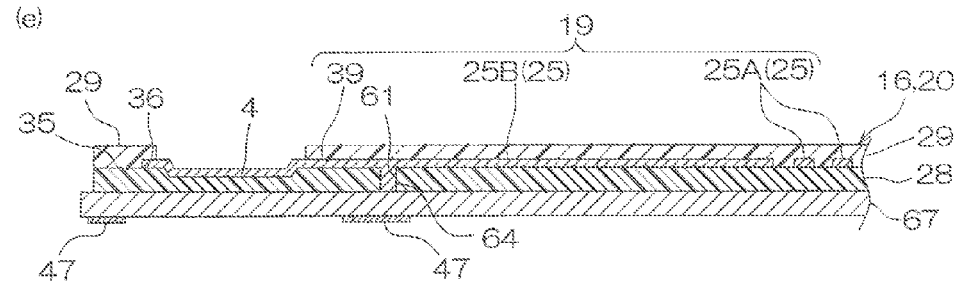
(e)
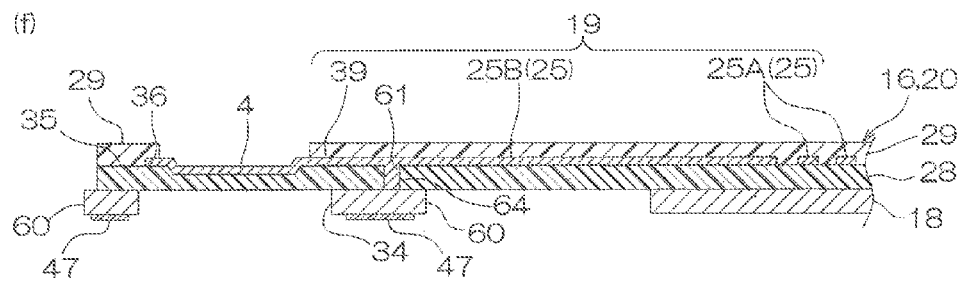
(f)
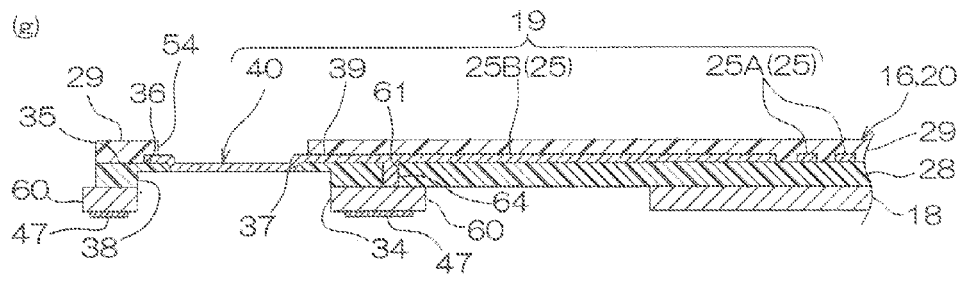
(g)
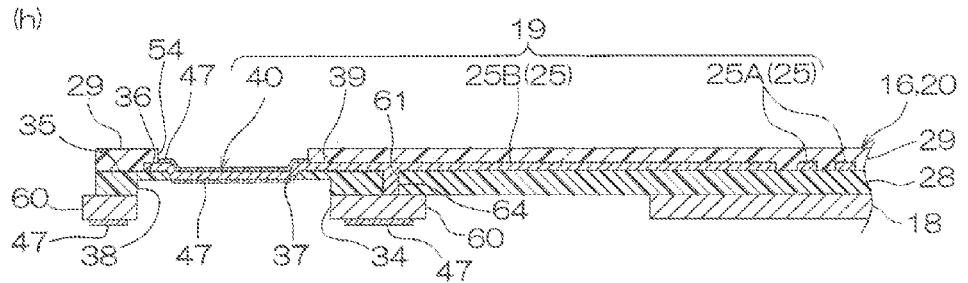
(h)

WIRED CIRCUIT BOARD

CROSS-REFERENCE TO RELATED APPLICATION

The present application claims the benefit of U.S. Provisional Application No. 61/630,275, filed on Dec. 8, 2011, and also claims priority from Japanese Application No. 2011-258865 filed on Nov. 28, 2011, the contents of which are herein incorporated by reference in their entirety.

BACKGROUND OF THE INVENTION

1. Field of the Invention

The present invention relates to a wired circuit board, and particularly to a wired circuit board used appropriately as a suspension board with circuit used in a hard disk drive.

2. Description of the Related Art

A wired circuit board such as a suspension board with circuit includes a metal supporting board, an insulating base layer formed thereon, and a conductive pattern formed thereon and having head-side terminals for connecting to a magnetic head. On the suspension board with circuit, a magnetic head is mounted and connected to a head-side terminal portion to allow the suspension board with circuit to be used in a hard disk drive.

In recent years, it has been proposed to mount various electronic elements on such a suspension board with circuit. Specific examples of such electronic elements include a microactuator having a piezo-element (piezoelectric element) for precisely and finely adjusting the position and angle of a magnetic head.

For example, it has been proposed that, in a connection structure between a piezoelectric actuator and a wiring member including a base material, an electrical insulating layer formed on a surface thereof and having a through hole, and a wiring portion formed on the top surface thereof, a liquid stopping member is provided around the through hole in the back surface of the electrical insulating layer, and a liquid conductive adhesive is injected into the through hole to connect the wiring portion and the electrodes of the piezoelectric actuator (see, e.g., Japanese Unexamined Patent No. 2010-86649 (see FIG. 6(C)).

In Japanese Unexamined Patent No. 2010-86649, the conductive adhesive comes in contact with each of the top surfaces of the electrodes of the piezoelectric actuator and the back surface of the wiring portion in the through hole to electrically connect the electrodes of the piezoelectric actuator to the wiring portion.

SUMMARY OF THE INVENTION

In recent years, it has been required to further improve the reliability of electrical connection between a piezoelectric actuator and a wiring portion via a conductive adhesive. In particular, excellent connection reliability in a high-temperature atmosphere is required.

It is therefore an object of the present invention to provide a wired circuit board which allows an improvement in the reliability of electrical connection between an electronic element and a conductor layer.

A wired circuit board of the present invention includes an insulating layer formed with a first opening and a second opening arranged to be spaced apart from each other and extend through the insulating layer in a thickness direction, a conductive layer formed on the insulating layer and including a terminal overlapping the first opening when projected in the thickness direction, and a wire having a part thereof overlapping the second opening when projected in the thickness direction and continued to the terminal, a metal pedestal portion formed under the insulating layer and disposed around the first opening so as to overlap the second opening when projected in the thickness direction and support an electronic element, and a conductive portion filling the second opening to provide electrical conduction between the wire and the metal pedestal portion.

In the wired circuit board of the present invention, it is preferable that the terminal is used to be connected to the electronic element via a conductive adhesive.

It is preferable that the wired circuit board of the present invention further includes a plating layer formed on a surface of the terminal.

It is preferable that the wired circuit board of the present invention further includes a plating layer formed on a surface of the terminal and on a surface of the metal pedestal portion.

In the wired circuit board of the present invention, if the terminal is provided with the conductive adhesive, the conductive adhesive is electrically connected to the terminal.

On the other hand, the metal pedestal portion is electrically connected to the wire via the conductive portion.

If the electronic element is supported on the metal pedestal portion, it is possible to electrically connect the electrode of the electronic element to the terminal via the conductive adhesive, and also electrically connect the electrode of the electronic element to the wire via the metal pedestal portion and the conductive portion.

Therefore, it is possible to improve the reliability of the electric connection between the electrode of the electronic element and the conductive layer.

BRIEF DESCRIPTION OF THE DRAWINGS

FIG. 11 is a process view for illustrating a producing method of the suspension board with circuit shown in FIG. 10, (a) showing the step of preparing a metal supporting layer,
(b) showing the step of forming an insulating base layer,
(c) showing the step of forming a conductive layer and a conductive portion, and
(d) showing the step of forming an insulating cover layer; and FIG. 12 is a process view for illustrating the producing method of the suspension board with circuit, which is subsequent to FIG. 11, (e) showing the step of forming a plating layer on the surface of the metal supporting layer,
(f) showing the step of forming a metal pedestal portion,
(g) showing the step of forming a first upper base opening and a first lower base opening, and
(h) forming a plating layer on the surface of each of terminals.

DETAILED DESCRIPTION OF THE INVENTION

Figure 1:
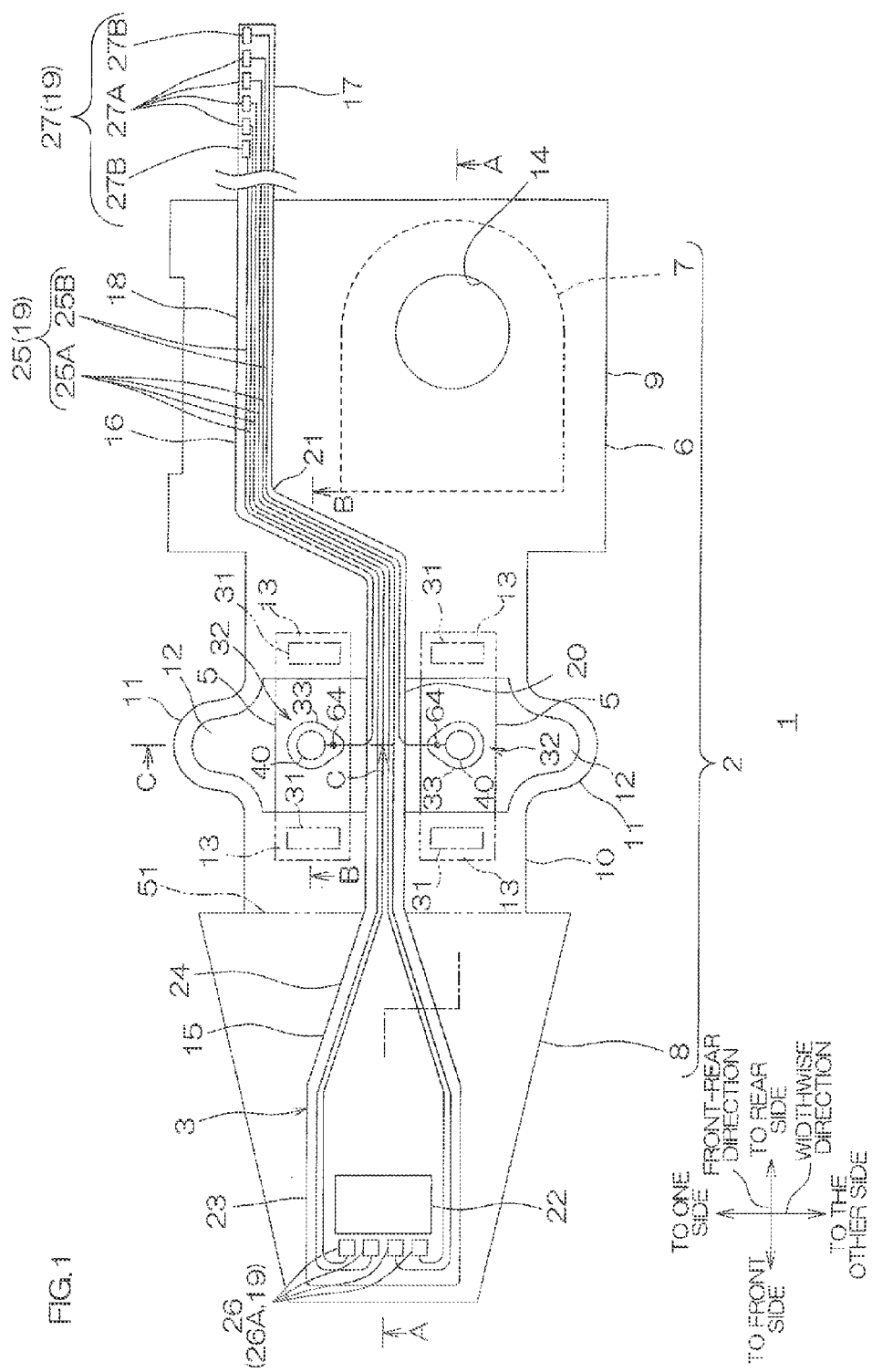
FIG. 1 shows a plan view of an assembly including a suspension board with circuit as an embodiment of a wired circuit board of the present invention.
Figure 2:
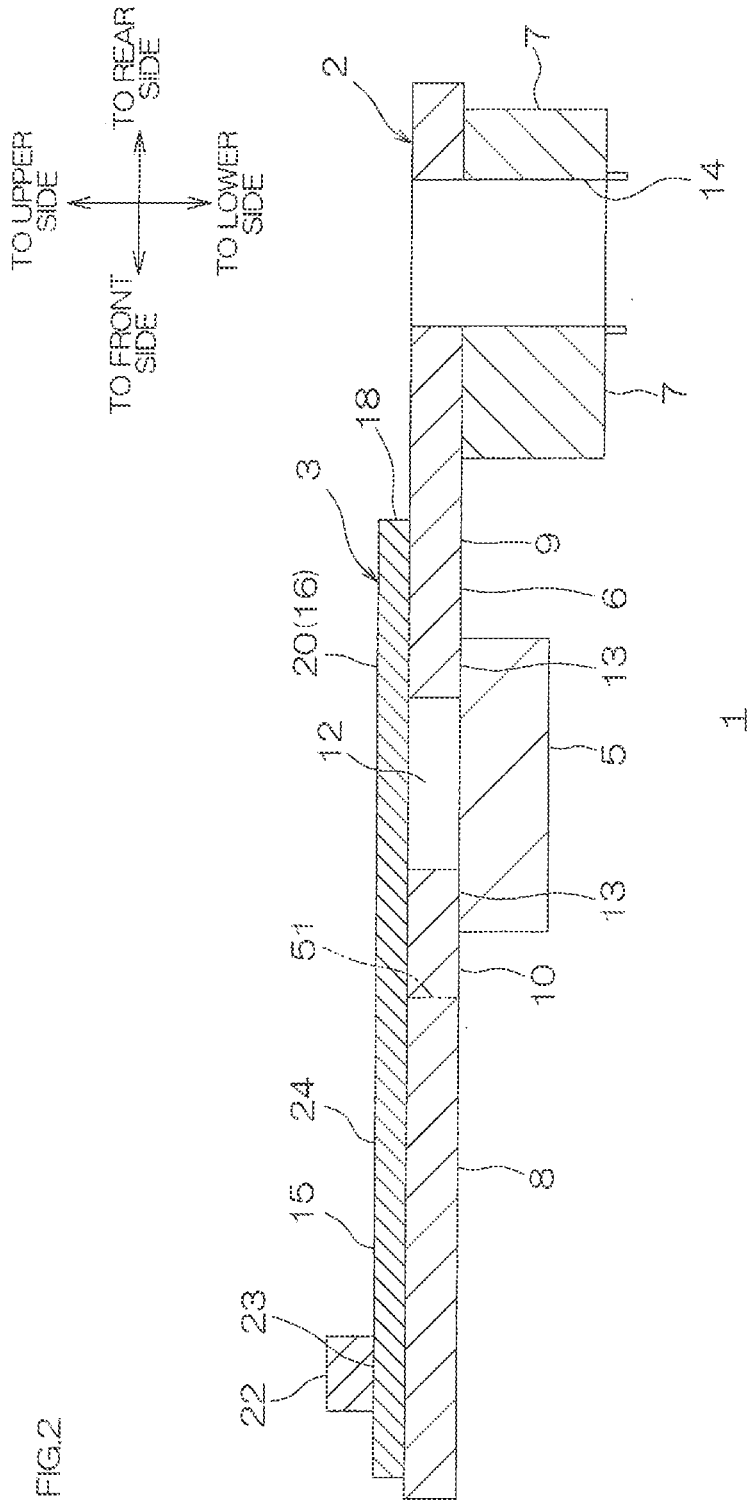
FIG. 2 shows a cross-sectional view of the assembly shown in FIG. 1, which is taken along the line A-A.
Figure 3:
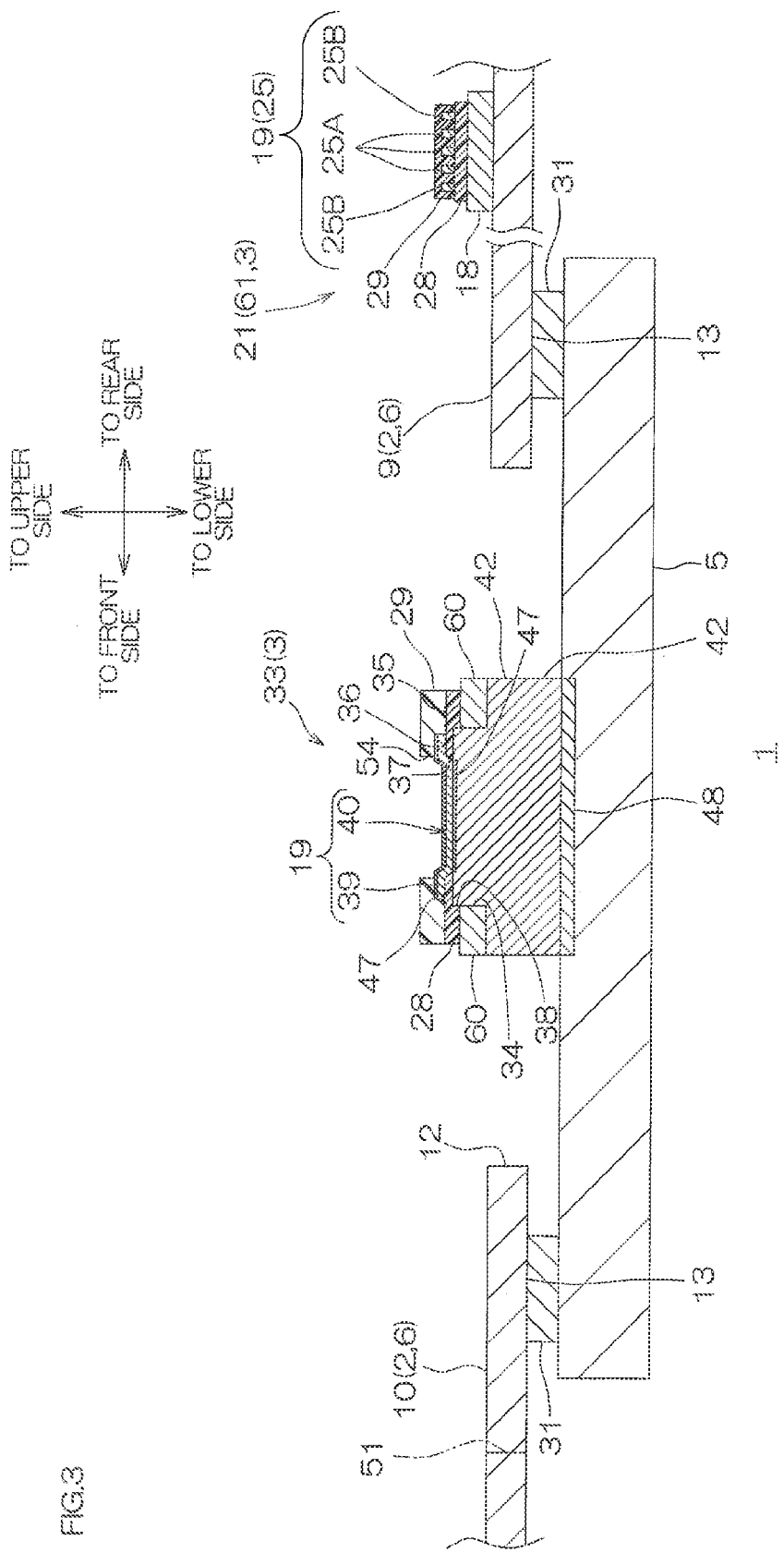
FIG. 3 shows a cross-sectional view of the assembly shown in FIG. 1, which is taken along the line B-B.
Figure 4:
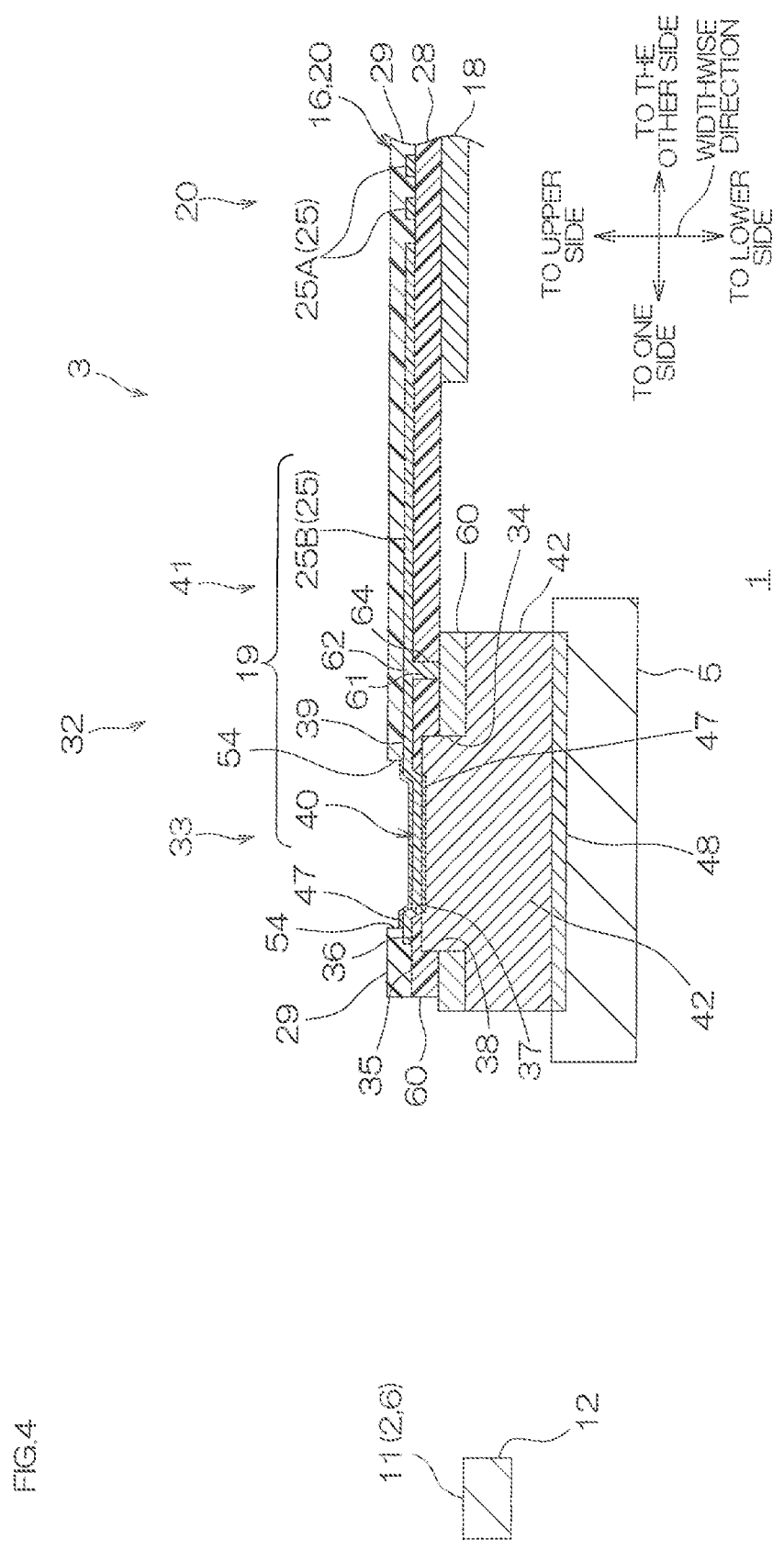
FIG. 4 shows a cross-sectional view of the assembly shown in FIG. 1, which is taken along the line C-C.
Figure 5:
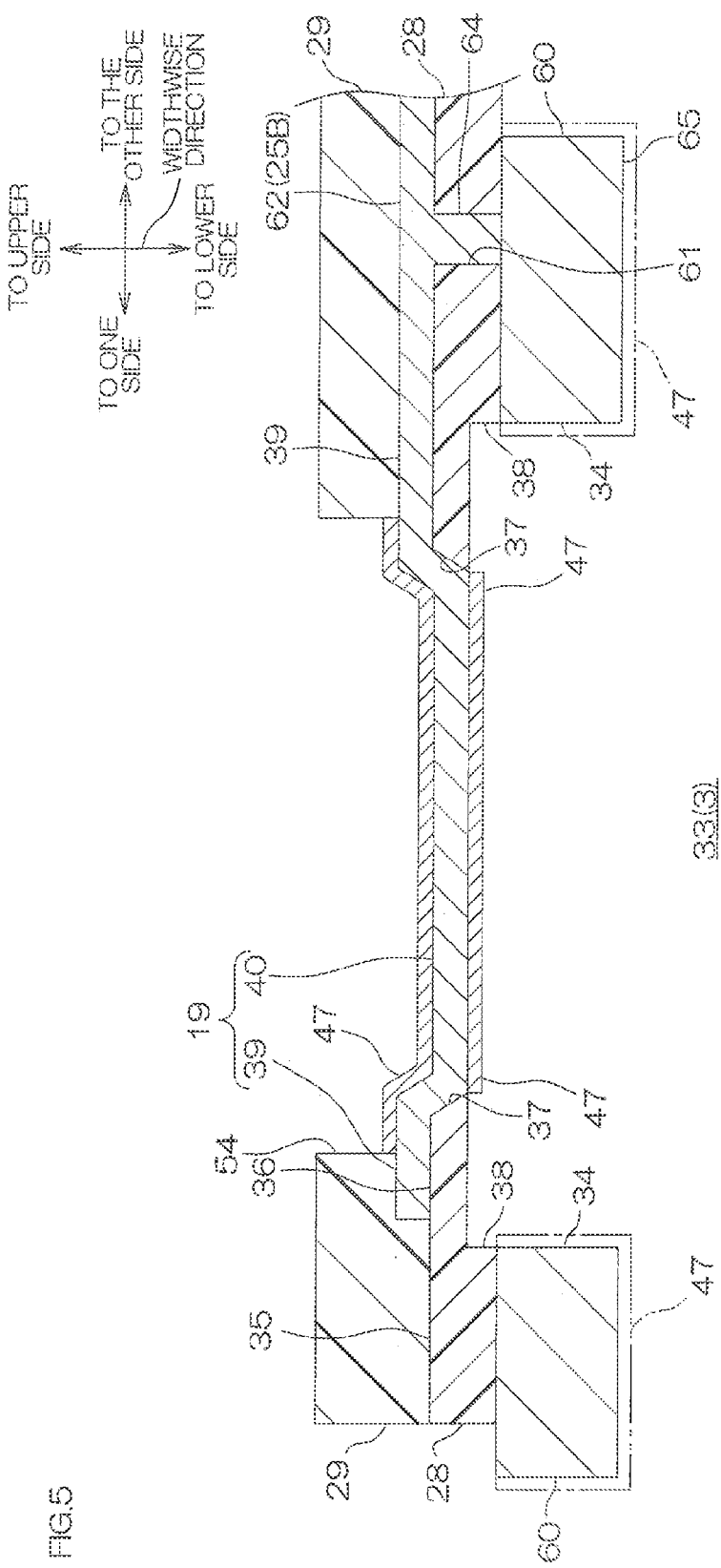
FIG. 5 shows an enlarged cross-sectional view of a pad portion of the assembly shown in FIG. 4.
Figure 6:
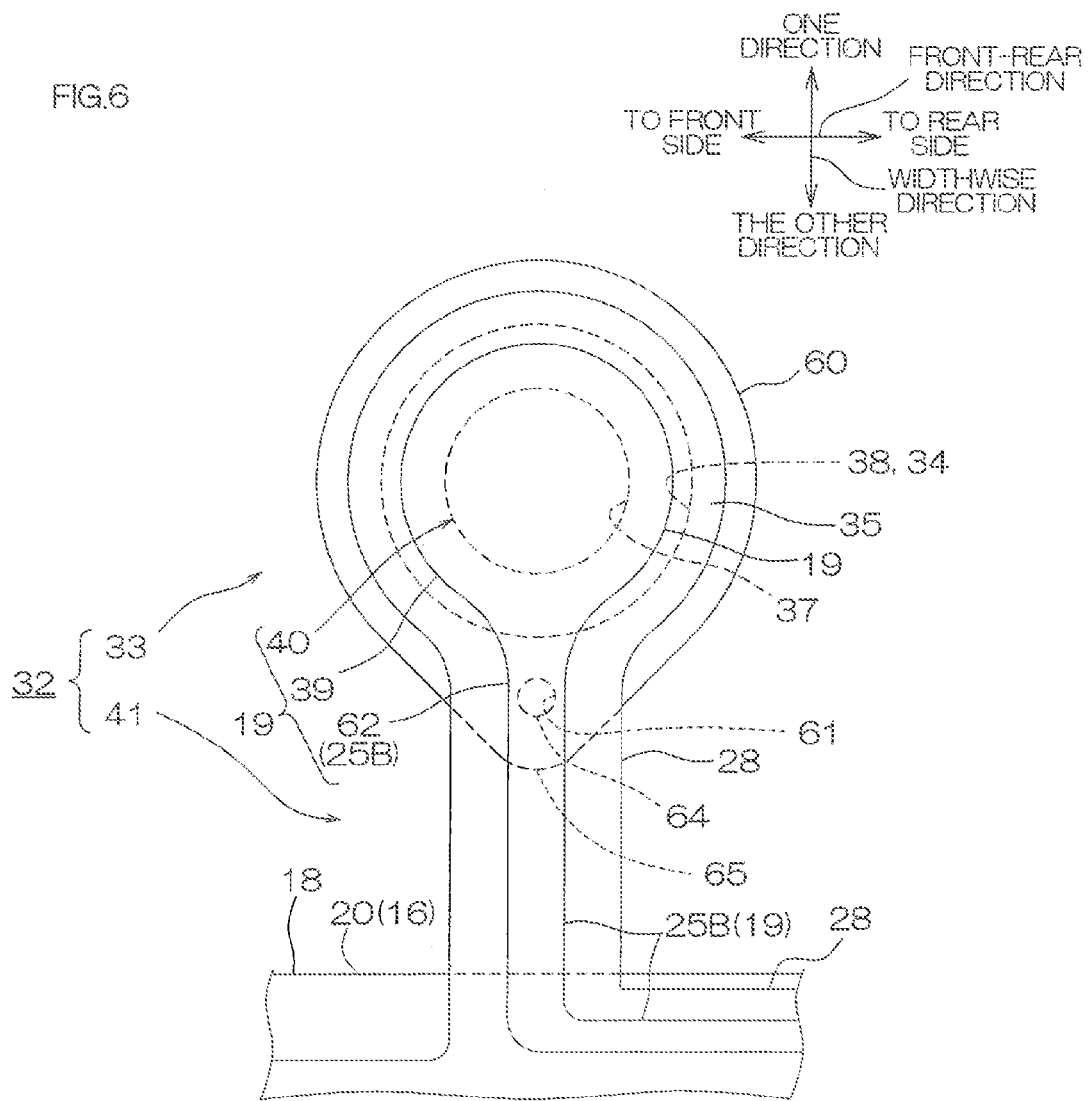
FIG. 6 shows an enlarged plan view of a connecting arm of the assembly shown in FIG. 1.
Figure 7:
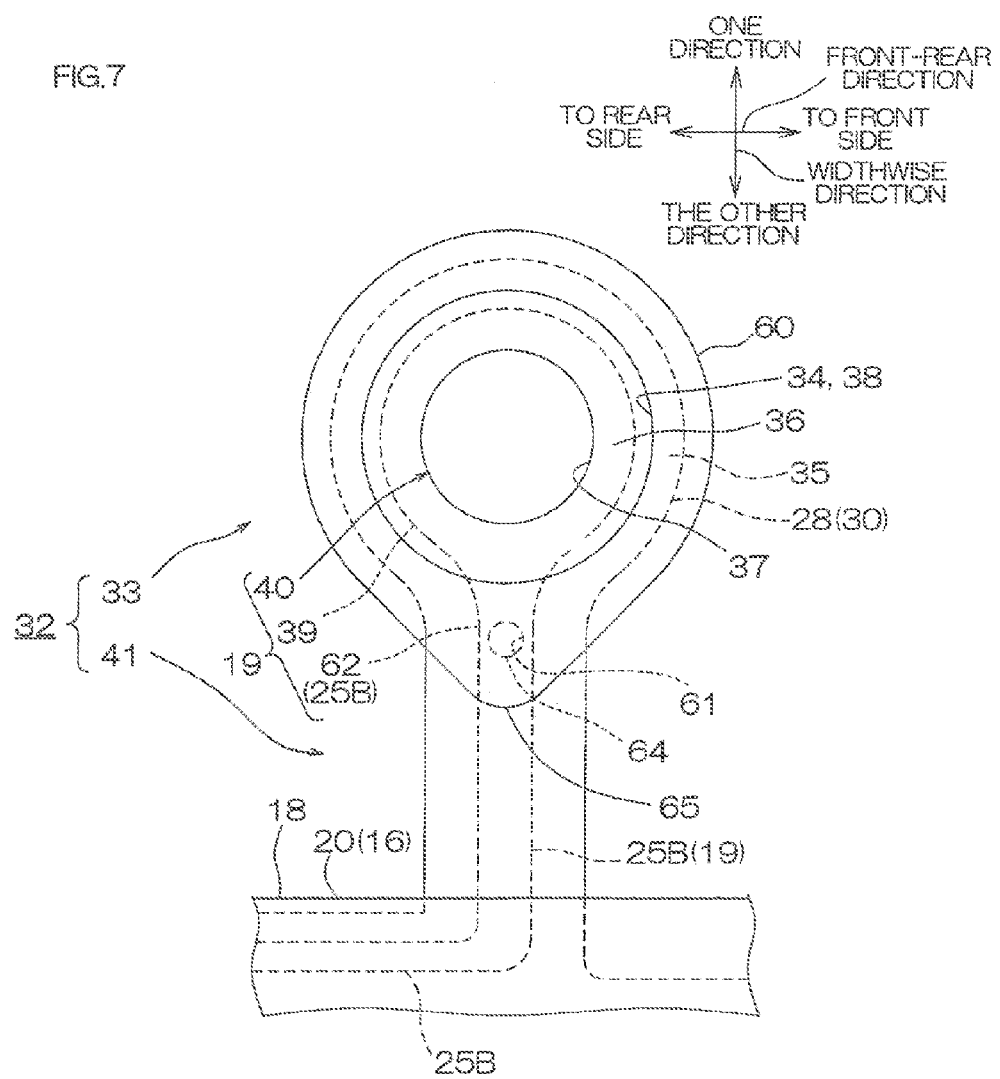
FIG. 7 shows an enlarged bottom view of the connecting arm of the assembly shown in FIG. 1.
Figure 8:
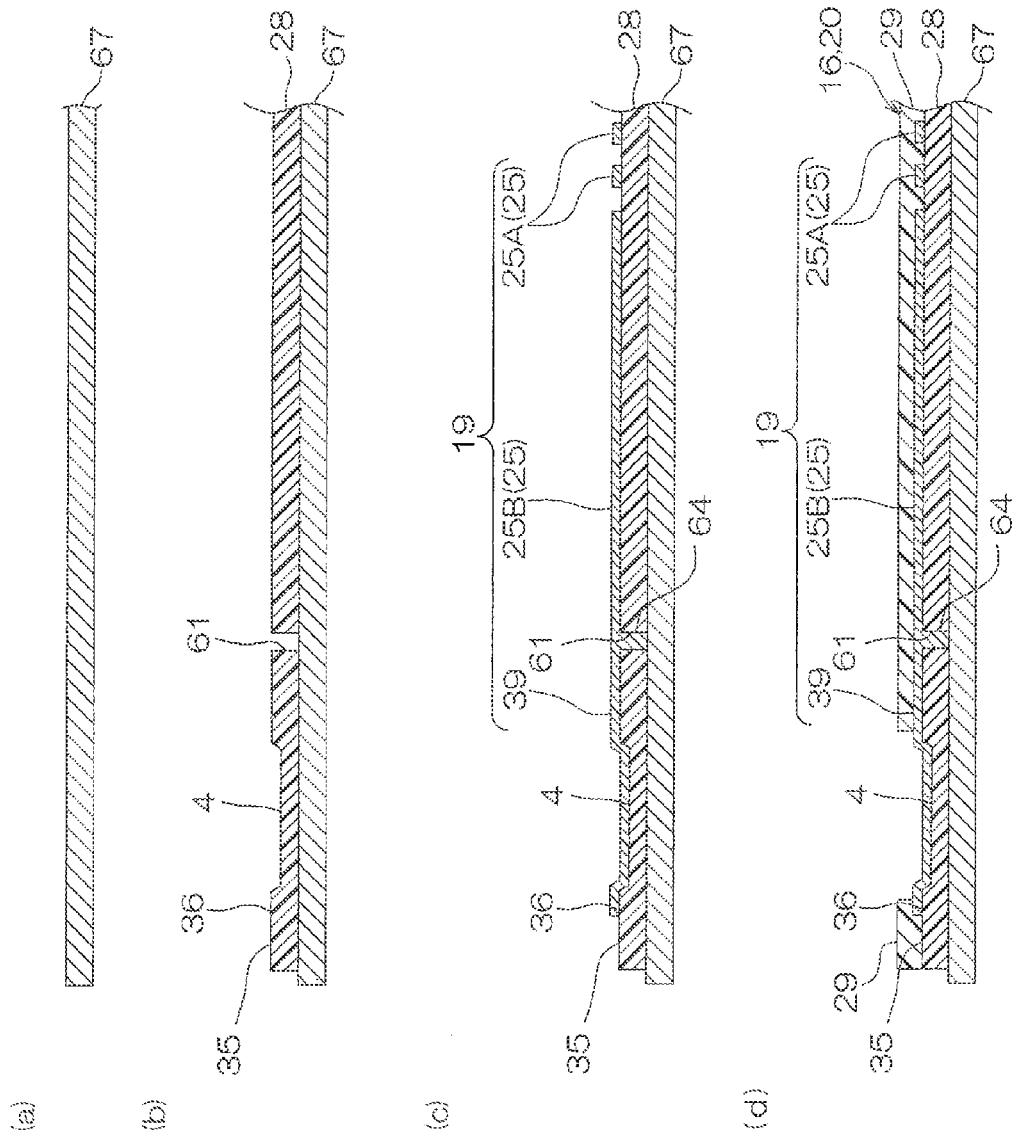
FIG. 8 is a process view for illustrating a producing method of the suspension board with circuit, (a) showing the step of preparing a metal supporting layer, (b) showing the step of forming an insulating base layer, (c) showing the step of forming a conductive layer and a conductive portion, and (d) showing the step of forming an insulating cover layer.
Figure 9:
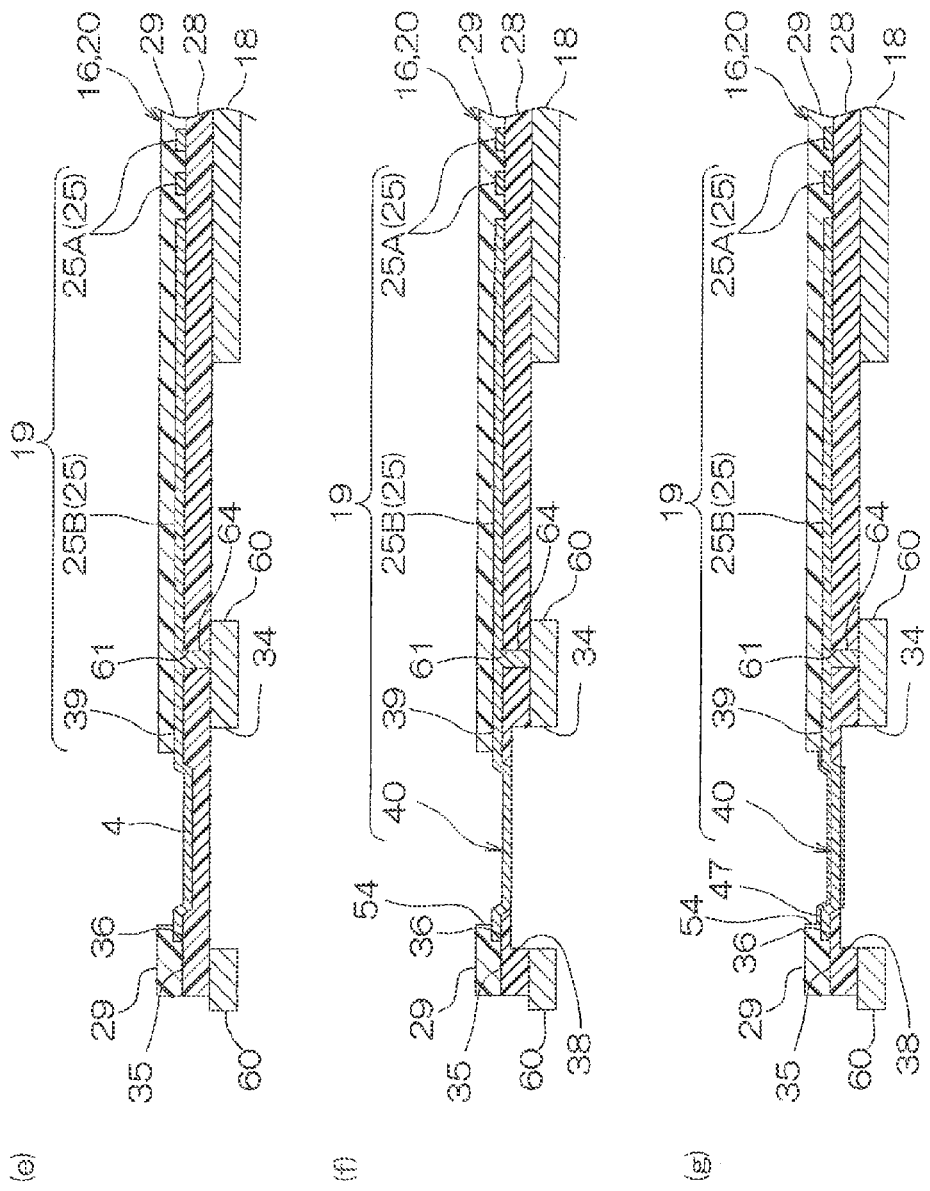
FIG. 9 is a process view for illustrating the producing method of the suspension board with circuit, which is subsequent to FIG. 8, (e) showing the step of forming a metal pedestal portion, (f) showing the step of forming a first upper base opening and a first lower base opening, and (g) showing the step of forming a plating layer.

FIG. 1 shows a plan view of an assembly including a suspension board with circuit as an embodiment of a wired circuit board of the present invention. FIG. 2 shows a cross-sectional view of the assembly shown in FIG. 1, which is taken along the line A-A. FIG. 3 shows a cross-sectional view of the assembly shown in FIG. 1, which is taken along the line B-B. FIG. 4 shows a cross-sectional view of the assembly shown in FIG. 1, which is taken along the line C-C. FIG. 5 shows an enlarged cross-sectional view of a pad portion of the assembly shown in FIG. 4. FIG. 6 is an enlarged plan view of a connecting arm of the assembly shown in FIG. 1. FIG. 7 is an enlarged bottom view of the connecting arm of the assembly shown in FIG. 1. FIGS. 8 and 9 are process views for illustrating a producing method of the suspension board with circuit.

Note that, in FIG. 1, an insulating base layer 28 and an insulating cover layer 29 are omitted for clear illustration of relative positioning of a metal supporting board 18 and a conductive layer 19. Also, in FIG. 5, a conductive adhesive 42 described later is omitted for clear illustration of the conductive layer 19. Also, in FIG. 6, the insulating cover layer 29 is omitted for clear illustration of relative positioning of a metal pedestal portion 60 and a piezoelectric-side terminal 40.

In FIGS. 1 and 2, an assembly 1 is a head-stack assembly (HSA) to be mounted in a hard disk drive (not shown). In the assembly 1, a suspension board with circuit 3 on which a slider 22 mounting a magnetic head (not shown) thereon is mounted is supported on a support plate 2. The assembly 1 includes the support plate 2, the suspension board with circuit 3 disposed on the support plate 2 and supported on the support plate 2, and piezoelectric elements (piezo-elements) 5 as electronic elements for accurately and finely adjusting the position and angle of the suspension board with circuit 3, while being supported on the support plate 2.

The support plate 2 is formed so as to extend in a longitudinal direction (front-rear direction), and includes an actuator plate portion 6, a base plate portion 7 formed under the actuator plate portion 6, and a load beam portion 8 formed to be continued to the front side of the actuator plate portion 6.

The actuator plate portion 6 integrally includes a rear plate portion 9, a front plate portion 10 disposed on the front side of the rear plate portion 9 to be spaced apart therefrom, and flexible portions 11 formed between the rear plate portion 9 and the front plate portion 10.

The rear plate portion 9 is formed in a generally rectangular shape in plan view in the rear end portion of the actuator plate portion 6.

The front plate portion 10 is formed in a generally rectangular shape in plan view extending in a widthwise direction (direction perpendicular to the front-rear direction).

The flexible portions 11 are provided on both widthwise sides of the actuator plate portion 6. The flexible portion 11 on one widthwise side is formed to extend between the front end portion of the rear plate portion 9 and the rear end portion of the front plate portion 10. Also, the flexible portion 11 on the other widthwise side is formed to extend between the front end portion of the rear plate portion 9 and the rear end portion of the front plate portion 10.

The both flexible portions 11 have respective middle portions thereof in the front-rear direction which are formed to be curved outwardly on both widthwise sides and have generally equal widths throughout the front-rear direction. Specifically, the middle portions of the flexible portions 11 in the front-rear direction are formed so as to outwardly protrude into generally U-shapes (or generally V-shapes) on both widthwise sides.

Accordingly, the flexible portions 11 are formed to be able to bring the front plate portion 10 away from and closer to the rear plate portion 9 due to the extension/contraction of the piezoelectric elements 5, as described later.

The actuator plate portion 6 is also formed with a plate opening 12 defined by the front surface of the rear plate portion 9, the rear surface of the front plate portion 10, and the widthwise inner surfaces of the flexible portions 11. The plate opening 12 extends through the actuator plate portion 6 in the thickness direction thereof.

In the front end portion of the rear plate portion 9 and the rear end portion of the front plate portion 10, two pairs of attachment regions 13 to which the rear end portions and front end portions of the piezoelectric elements 5 are respectively attached are defined. Each of the attachment regions 13 is formed in a widthwise elongated generally rectangular shape in bottom view in one widthwise end portion and in the other widthwise end portion to correspond to the front end portion of the rear plate portion 9 and the rear end portion of the front plate portion 10.

The base plate portion 7 is fixed to the middle portion of the lower surface of the rear plate portion 9 in each of the widthwise direction and the front-rear direction. The base plate portion 7 has a front portion thereof formed in a generally rectangular shape and a rear portion thereof formed in a generally semi-circular shape when viewed in plan view.

The support plate 2 is formed with a hole 14 having a generally circular shape in bottom view and extending through the middle portion of the rear plate portion 9 and the middle portion of the base plate portion 7.

Note that, to the base plate portion 7, a drive coil (not shown) for causing the front end portion of the assembly 1 to swing around the hole 14 is attached.

The load beam portion 8 is integrally formed with the actuator plate portion 6. Specifically, the load beam portion 8 is formed to extend from the front end of the front plate portion 10 toward the front side, and formed in a generally trapezoidal shape which gradually decreases in width with approach to the frontmost portion when viewed in plan view.

The support plate 2 is formed of a metal material such as, e.g., stainless steel, aluminum, iron, or an alloy thereof.

The size of the support plate 2 is set appropriately. For example, the thickness of each of the actuator plate portion 6 and the load beam portion 8 is in a range of, e.g., 30 to 150 μm, and the thickness of the base plate portion 7 is in a range of, e.g., 150 to 200 μm.

Note that the support plate 2 is provided as an integrated actuator-plate/load-beam plate integrally including the actuator plate portion 6 and the load beam portion 8.

The suspension board with circuit 3 is formed in a generally flat-belt shape in plan view extending in the front-rear direction.

As shown in FIG. 1, the suspension board with circuit 3 is provided with the metal supporting board 18 and the conductive layer 19 supported on the metal supporting board 18.

The metal supporting board 18 is formed so as to correspond to the outer shape of the suspension board with circuit 3, and integrally includes a wiring portion 16, a front portion 15 formed on the front side of the wiring portion 16, and a rear portion 17 formed on the rear side of the wiring portion 16.

The wiring portion 16 integrally includes a linear portion 20 formed in the middle portion of the metal supporting board 18 in the front-rear direction and extending in the front-rear direction, and a bent portion 21 bent to one side in the widthwise direction from the rear end portion of the linear portion 20, and then further bent rearward. Note that the linear portion 20 and the bent portion 21 are formed to have generally equal widths throughout the front-rear direction.

The wiring portion 16 supports wires 25 (described later).

The front portion 15 is formed in a generally rectangular shape in plan view continued from the front end of the linear portion 20 and slightly protruding outward on both widthwise sides from the wiring portion 16. Specifically, the front portion 15 includes a gimbal 23 on which the slider 22 (described later) is mounted, and a gimbal rear portion 24 connecting the gimbal 23 and the linear portion 20.

The gimbal 23 is formed in a generally rectangular shape in plan view having a width larger than the width of the linear portion 20. The gimbal 23 supports front-side terminals 26 (described later), while mounting thereon the slider 22 (described later) having the magnetic head (not shown) electrically connected to the front-side terminals 26.

The gimbal rear portion 24 is formed in a generally triangular shape continued to the rear end of the gimbal 23 and gradually decreasing in width with approach to the rearmost portion. The gimbal rear portion 24 supports the wires 25.

The rear portion 17 is formed in a generally rectangular shape in plan view continued from the rear end of the bent portion 21 and having generally the same width as that of the bent portion 21. The rear portion 17 supports rear-side terminals 27 (described later).

The conductive layer 19 integrally includes the wires 25 extending along the front-rear direction, the front-side terminals 26 continued to the front end portions of the wires 25, and the rear-side terminals 27 continued to the rear end portions of the wires 25 on the metal supporting board 18.

The wires 25 include signal wires 25A each for transmitting an electric signal between the magnetic head (not shown) and a read/write board (not shown), and disposed throughout the front-rear direction of the suspension board with circuit 3. The plurality of (four) signal wires 25A are arranged in widthwise spaced-apart relation.

The wires 25 also include a plurality of (two) power-source wires 25B.

The power-source wires 25B are electrically connected to power-source-side terminals 27B described next. The power-source wires 25B are disposed to be continued to the power-source-side terminals 27B in the rear portion 17, arranged in parallel and spaced-apart relation on both sides of the signal wires 25A in the rear portion 17 and the bent portion 21, and curved outwardly on both widthwise sides in the middle portion of the linear portion 20 in the front-rear direction to reach the piezoelectric-side terminals 40 (see FIG. 4) described later.

The front-side terminals 26 are disposed on the front portion 15. Specifically, the plurality of (four) front-side terminals 26 are arranged along the front end surface of the slider 22 in widthwise spaced-apart relation on the front side of the gimbal 23.

The front-side terminals 26 are head-side terminals 26A electrically connected to the magnetic head (not shown).

The rear-side terminals 27 are disposed on the rear end portion of the rear portion 17. Specifically, the plurality of (six) rear-side terminals 27 are arranged to be spaced apart from each other in the front-rear direction. The rear-side terminals 27 include a plurality of (four) external terminals 27A continued to the signal wires 25A, and connected to the terminals of the read/write board.

The rear-side terminals 27 also include the plurality of (two) power-source-side terminals 27B continued to the power-source wires 25B and electrically connected to the piezoelectric elements 5. Note that the power-source-side terminals 27B are disposed in spaced-apart relation on both sides of the external terminals 27A in the front-rear direction, and electrically connected to a power source (not shown).

As shown in FIGS. 3 and 4, the suspension board with circuit 3 includes the metal supporting board 18, the insulating base layer 28 formed thereon, the conductive layer 19 formed on the insulating base layer 28, and the insulating cover layer 29 formed on the insulating base layer 28 so as to cover the wires 25.

The metal supporting board 18 is formed of a metal material such as, e.g., stainless steel, a 42-alloy, aluminum, a copper-beryllium alloy, or phosphor bronze. Preferably, the metal supporting board 18 is formed of stainless steel. The thickness of the metal supporting board 18 is in a range of, e.g., 15 to 25 μm, preferably 17 to 22 μm, or more preferably 18 to 20 μm.

As shown in FIG. 1, the insulating base layer 28 is formed in a pattern corresponding to the conductive layer 19 on the upper surface of the metal supporting board 18 in the front portion 15, the wiring portion 16, and the rear portion 17.

The insulating base layer 28 is formed of an insulating material such as a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 28 is formed of a polyimide resin.

The thickness (maximum thickness) of the insulating base layer 28 is in a range of, e.g., 4 to 15 μm, preferably 6 to 12 μm, or more preferably 8 to 10 μm.

As shown in FIGS. 1 and 3, the conductive layer 19 is formed in the foregoing pattern over the upper surface of the insulating base layer 28 in the front portion 15, the wiring portion 16, and the rear portion 17.

The conductive layer 19 is formed of a conductive material such as, e.g., copper, nickel, gold, a solder, or an alloy thereof. Preferably, the conductive layer 19 is formed of copper.

The thickness of the conductive layer 19 is in a range of, e.g., 4 to 15 μm, preferably 6 to 12 μm, or more preferably 8 to 10 μm.

The width of each of the wires 25 is in a range of, e.g., 5 to 200 μm, or preferably 8 to 100 μm. The spacing between the individual wires 25 is in a range of, e.g., 5 to 1000 μm, or preferably 8 to 100 μm.

The widths and lengths of the front-side terminals 26 and the rear-side terminals 27 are in a range of, e.g., 20 to 1000 μm, or preferably 30 to 800 μm. The spacing between the individual front-side terminals 26 and the spacing between the individual rear-side terminals 27 are in a range of, e.g., 20 to 1000 μm, or preferably 30 to 800 μm.

The insulating cover layer 29 is formed over the wiring portion 16, the front portion 15, and the rear portion 17 so as to cover the upper surface of the insulating base layer 28 around the wires 25 and the upper surface and side surfaces of the wires 25. The insulating cover layer 29 is also formed in a pattern exposing the front-side terminals 26 in the front portion 15 and exposing the rear-side terminals 27 in the rear portion 17, though not shown.

The insulating cover layer 29 is formed of the same insulating material as the insulating material of the insulating base layer 28. The thickness of the insulating cover layer 29 is in a range of, e.g., 2 to 7 μm, preferably 3 to 6 μm, or more preferably 4 to 5 μm.

In the suspension board with circuit 3, as shown in FIGS. 1 and 2, the lower surface of the metal supporting board 18 is supported on the support plate 2. Specifically, the lower surfaces of the wiring portion 16 and the front portion 15 are supported on the support plate 2, while the lower surface of the rear portion 17 protrudes rearward from the support plate 2 without being supported on the support plate 2.

Specifically, in the suspension board with circuit 3, the bent portion 21 is disposed in a generally L-shape along the one widthwise end portion of the rear plate portion 9 and the front end portion thereof, and the linear portion 20 is disposed to extend from the widthwise middle portion of the front end portion of the rear plate portion 9, traverse the widthwise middle portion of the plate opening 12, and then reach the widthwise middle portion of the front plate portion 10. Also, in the suspension board with circuit 3, the front portion 15 is disposed to be formed on the widthwise middle portion of the load beam portion 8 to extend throughout the front-rear direction of the load beam portion 8.

The piezoelectric elements 5 are attached to the lower side of the support plate 2.

Specifically, the plurality of (two) piezoelectric elements 5 are provided in widthwise spaced-apart relation.

Each of the piezoelectric elements 5 is an actuator extendible/contractable in the front-rear direction, and is formed in a generally rectangular shape in plan view elongated in the front-rear direction. The piezoelectric element 5 is disposed so as to span the plate opening 12 in the front-rear direction.

Specifically, the both end portions of each of the piezoelectric elements 5 in the front-rear direction are bonded to the attachment regions 13 (broken lines of FIG. 1) in the front end portion of the rear plate portion 9 and in the rear end portion of the front plate portion 10 via adhesive layers 31, and fixed thereto.

As shown in FIG. 3, in the middle portion of the upper surface of each of the piezoelectric elements 5 in the front-rear direction, an electrode 48 is provided, and electrically connected to the conductive layer 19 of the suspension board with circuit 3, while being supported on the metal pedestal portion 60 described next.

Each of the piezoelectric elements 5 is supplied with electricity from the conductive layer 19, and the voltage thereof is controlled to extend/contract the piezoelectric element 5.

Next, a detailed description is given to the piezoelectric-side terminal 40 on one widthwise side in the suspension board with circuit 3, the metal pedestal portion 60 surrounding the piezoelectric-side terminal 40, and a conductive portion 64 provided in the vicinity thereof with reference to FIGS. 3 to 9. Note that the piezoelectric-side terminal 40, the metal pedestal portion 60, and the conductive portion 64 each on the other widthwise side are formed to be symmetrical with the piezoelectric-side terminal 40, the metal pedestal portion 60, and the conductive portion 64 each on one widthwise side with respect to the linear portion 20, and a description thereof is omitted.

In the suspension board with circuit 3, as shown in FIGS. 6 and 7, a connecting arm 32 including the piezoelectric-side terminal 40, the metal pedestal portion 60, and the conductive portion 64 is provided.

The connecting arm 32 is provided so as to protrude widthwise outward in an arm-like shape from the middle portion of the linear portion 20 in the front-rear direction thereof.

The connecting arm 32 includes a pad portion 33 disposed on one widthwise side of the linear portion 20 to be spaced apart therefrom, and a joint portion 41 coupling the pad portion 33 to the linear portion 20.

As shown in FIG. 5, the pad portion 33 includes the insulating base layer 28, the conductive layer 19 formed on the insulating base layer 28, the insulating cover layer 29 formed on the insulating base layer 28 so as to cover the conductive layer 19, the metal pedestal portion 60 formed under the insulating base layer 28, and the conductive portion 64.

In the pad portion 33, as shown in FIGS. 6 and 7, the insulating base layer 28 is formed in a generally annular (ring) shape in plan view. Also, as shown in FIGS. 5 and 6, the middle portion of the insulating base layer 28 is formed with a first upper base opening 37 as a first opening having a generally circular shape in plan view and extending therethrough in the thickness direction.

Also, as shown in FIG. 5, an inner peripheral portion 36 of the insulating base layer 28 in the pad portion 33 is formed thinner than an outer peripheral portion 35 thereof defined outside the inner peripheral portion 36. Specifically, the thickness of the inner peripheral portion 36 is in a range of, e.g., 1.5 to 5 μm.

At a position inward of the outer peripheral portion 35 and under the inner peripheral portion 36, a first lower base opening 38 is formed. The first lower base opening 38 is disposed to be concentric with the first upper base opening 37 and formed to have an inner diameter larger than the inner diameter of the first upper base opening 37.

In the pad portion 33, as shown in FIGS. 5 and 7, the insulating base layer 28 has a second base opening 61 as a second opening which is formed in the other widthwise end portion thereof to have a generally circular shape in plan view and extend therethrough in the thickness direction.

The second base opening 61 is formed on the other widthwise side of the first upper base opening 37 to be spaced apart therefrom. More specifically, the second base opening 61 is formed on the other widthwise side of the first lower base opening 38 to be spaced apart therefrom.

The conductive layer 19 includes a frame conductor 39 formed on the upper surface of the inner peripheral portion 36 of the insulating base layer 28, the piezoelectric-side terminal 40 as a terminal continued to the inside of the frame conductor 39, and one end portion 62 of the power source wire 25B.

As shown in FIG. 6, the frame conductor 39 is formed in a generally annular (ring) shape in plan view slightly smaller than the insulating base layer 28.

Specifically, the outer diameter of the frame conductor 39 is formed smaller than the outer diameter of the insulating base layer 28 when projected in the thickness direction, as shown in FIG. 3.

As shown in FIG. 5, the piezoelectric-side terminal 40 is formed in a generally circular shape in plan view continued to the inner peripheral portion of the frame conductor 39 when viewed in plan view.

The piezoelectric-side terminal 40 is formed as the conductive layer 19 overlapping the first upper base opening 37 of the insulating base layer 28 when projected in the thickness direction. More specifically, the piezoelectric-side terminal 40 is formed so as to be recessed from the inner peripheral portion of the frame conductor 39 into the first upper base opening 37 of the insulating base layer 28.

The lower surface of the piezoelectric-side terminal 40 is formed flush with the lower surface of the inner peripheral portion 36 of the insulating base layer 28 in each of the widthwise direction and the front-rear direction.

In the pad portion 33, as shown in FIGS. 5 and 6, the one end portion 62 of the power source wire 25B is formed to be continued to the other widthwise end portion of the frame conductor 39.

In the pad portion 33, as shown in FIG. 5, the insulating cover layer 29 has a generally annular (ring) shape in plan view (see FIG. 6), and is formed to have the same shape as the outer shape of the insulating base layer 28. That is, the outer peripheral surface of the insulating cover layer 29 is formed flush with the outer peripheral surface of the insulating base layer 28 in the thickness direction.

The insulating cover layer 29 covers the outer side portion of the frame conductor 39 and the one end portion 61 of the power source wire 25B.

In the pad portion 33, the insulating cover layer 29 has a cover opening 54 which is formed to extend through the middle portion thereof in the thickness direction. The cover opening 54 is formed so as to overlap the piezoelectric-side terminal 40 when projected in the thickness direction.

In the pad portion 33, as shown in FIG. 7, the metal pedestal portion 60 is formed in a generally drop-like frame shape which is like a drop falling toward one widthwise side when viewed in bottom view. Also, as shown in FIGS. 5 and 7, the metal pedestal portion 60 has a pedestal opening 34 formed in the middle portion thereof to have a generally circular shape in plan view and extend therethrough in the thickness direction.

The pedestal opening 34 is disposed around the first upper base opening 37. Specifically, the pedestal opening 34 is disposed to be concentric with the first upper base opening 37 and formed to have an inner diameter larger than that of the first upper base opening 37 of the insulating base layer 28. The metal pedestal portion 60 is formed to have an outer diameter larger than the outer diameter of the insulating base layer 28.

The pedestal opening 34 communicates with the first lower base opening 38. Specifically, the pedestal opening 34 is formed to overlap the first lower base opening 38 of the insulating base layer 28 when viewed in bottom view. That is, the pedestal opening 34 is formed such that the inner peripheral surface thereof is flush with the inner peripheral surface of the first lower base opening 38 in the thickness direction.

Also, the metal pedestal portion 60 has the other widthwise end portion thereof which is formed to protrude toward the other widthwise side. A resulting protruding portion 65 includes the second base opening 61 when viewed in bottom view.

The metal pedestal portion 60 is formed of the same metal material as that of the metal supporting board 18. The thickness of the metal pedestal portion 60 is the same as the thickness of the metal supporting board 18.

As shown in FIGS. 5 and 6, in the pad portion 33, the conductive portion 64 fills the second base opening 61 of the insulating base layer 28. Specifically, the conductive portion 64 is formed integrally with the one end portion 62 of the power source wire 25B and, more specifically, the upper portion of the conductive portion 64 is continued to the lower surface of the one end portion 62 of the power source wire 25B. On the other hand, the lower surface of the conductive portion 64 is in contact with the upper surface of the protruding portion 65 of the metal pedestal portion 60.

Thus, the conductive portion 64 electrically connects the power source wire 25B and the metal pedestal portion 60 (provides conduction therebetween).

The dimensions of the pad portion 33 are selected appropriately. As shown in FIG. 6, the outer diameter (maximum length) of the insulating base layer 28 (the outer peripheral portion 35 thereof) is in a range of, e.g., 100 to 1000 μm. As shown in FIG. 7, the inner diameter (outer diameter (maximum length) of the first upper base opening 37) of the inner peripheral portion 36 of the insulating base layer 28 is in a range of, e.g., 40 to 480 μm, preferably 100 to 300 μm, or more preferably 180 to 220 μm. The inner diameter (outer diameter (maximum length) of the first lower base opening 38) of the outer peripheral portion 35 of the insulating base layer 28 is in a range of, e.g., 50 to 500 μm, preferably 150 to 400 μm, or more preferably 200 to 300 μm.

The widthwise distance between the second base opening 61 and the first upper base opening 37 of the insulating base layer 28 is in a range of, e.g., 20 to 100 μm, preferably 30 to 90 μm, or more preferably 50 to 70 μm. The widthwise distance between the second base opening 61 and the first lower base opening 38 of the insulating base layer 28 is in a range of, e.g., 10 to 90 μm, preferably 20 to 80 μm, or more preferably 40 to 60 μm.

Also, as shown in FIG. 6, the outer diameter (maximum length) of the frame conductor 39 of the conductive layer 19 is in a range of, e.g., 90 to 990 μm. As shown in FIG. 7, the outer diameter (maximum length) of the piezoelectric-side terminal 40 is the same as the outer diameter (maximum length) of the first upper base opening 37.

The outer diameter (maximum length) of the insulating cover layer 29 is the same as the outer diameter (maximum length) of the insulating base layer 28. As shown in FIG. 5, the inner diameter (maximum length) of the cover opening 54 of the insulating cover layer 29 is in a range of, e.g., 40 to 480 μm, preferably 100 to 300 μm, or more preferably 180 to 220 μm.

The outer diameter (maximum length) of the metal pedestal portion 60 is in a range of, e.g., 100 to 1000 μm. The inner diameter (outer diameter (maximum length) of the pedestal opening 34) of the metal pedestal portion 60 is the same as, e.g., the inner diameter (outer diameter (maximum length) of the first lower base opening 38) of the outer peripheral portion 35 of the insulating base layer 28.

The distance between the outer peripheral surface of the metal pedestal portion 60 and the inner peripheral surface of the pedestal opening 34 is in a range of, e.g., 30 to 200 μm, preferably 50 to 150 μm, or more preferably 80 to 120 μm.

As shown in FIGS. 6 and 7, the joint portion 41 extends between one widthwise end portion of the middle portion of the linear portion 20 in the front-rear direction and the other widthwise end portion of the pad portion 33.

The joint portion 41 is formed in a generally rectangular shape in plan view extending in the widthwise direction and having a width smaller than the outer diameter (length in the front-rear direction shorter than that) of the pad portion 33.

As shown in FIGS. 4 and 6, the joint portion 41 includes the insulating base layer 28, the power-source wire 25B formed on the insulating base layer 28, and the insulating cover layer 29 (omitted in FIG. 6) formed so as to cover the power-source wire 25B.

In the joint portion 41, as shown in FIG. 6, the insulating base layer 28 is formed in a shape corresponding to the outer shape of the joint portion 41. The insulating base layer 28 in the joint portion 41 is formed to be continued to the insulating base layer 28 in the linear portion 20 and to the insulating base layer 28 in the pad portion 33.

The power-source wire 25B in the joint portion 41 is formed so as to extend along the widthwise direction, and formed to be continued to the power-source wire 25B in the linear portion 20 and to the frame conductor 39 in the pad portion 33.

In the joint portion 41, the insulating cover layer 29 is formed so as to cover the upper surface and side surfaces of the power-source wire 25B.

Also, in the suspension board with circuit 3, as shown in FIGS. 3 and 5, plating layers 47 are formed on the respective surfaces of the individual terminals, which are specifically the front-side terminals 26 (see FIG. 1), the rear-side terminals 27 (see FIG. 1), and the piezoelectric-side terminal 40, and the frame conductor 39.

In each of the pad portions 33, as shown in FIG. 5, the plating layer 47 is formed on the upper surface of the frame conductor 39, while being formed on the both upper and lower surfaces of the piezoelectric-side terminal 40.

The plating layer 47 is formed of a metal material such as, e.g., nickel or gold. Preferably, the plating film 47 is formed of gold. The thickness of the plating layer 47 is in a range of, e.g., 0.3 to 2 μm, preferably 0.5 to 1.5 μm, or more preferably 0.8 to 1.2 μm.

Next, a producing method of the assembly 1 is described.

To produce the assembly 1, each of the suspension board with circuit 3, the support plate 2, and the piezoelectric elements 5 is prepared first.

Next, a method of preparing (producing) the suspension board with circuit 3 is described with reference to FIGS. 8 and 9.

In the method, as shown in FIG. 8(a), the metal supporting layer 67 is prepared first.

The metal supporting layer 67 is a board for forming the metal supporting board 18 and the meal pedestal portions 60. The material and thickness of the metal supporting layer 67 are the same as those of the metal supporting board 18 and the metal pedestal portions 60 shown above.

Next, as shown in FIG. 8(b), the insulating base layer 28 is formed on the metal supporting layer 67.

Specifically, the insulating base layer 28 is formed on the metal supporting layer 67 into a pattern formed with opening formation regions 4 corresponding to the first upper base openings 37 (see FIG. 9(f)) formed next and with the second base openings 61.

Each of the opening formation regions 4 is defined as a portion formed thinner than the surrounding area thereof.

To form the insulating base layer 28, e.g., a varnish of a photosensitive insulating material is applied first to the upper surface of the metal supporting layer 67 and dried to form a photosensitive base coating.

Next, the photosensitive base coating is subjected to exposure (gradation exposure) via a gradation exposure photomask not shown. The gradation exposure photomask includes light shielding portions, light semi-transmitting portions, and a light full transmitting portion in a pattern. The light full transmitting portion is caused to face the portion of the base coating in which the insulating base layer 28 is formed (except for the opening formation regions 4), the light semi-transmitting portions are caused to face the portions of the base coating in which the opening formation regions 4 are formed, and the light shielding portions are caused to face the portions of the base coating in which the second base openings 61 are formed.

Thereafter, the base coating subjected to the gradation exposure is developed, and cured by heating as necessary to form the insulating base layer 28 into the foregoing pattern formed with the opening formation regions 4 and the second base openings 61.

Next, as shown in FIG. 8(c), the conductive layer 19 is formed over the upper surface of the insulating base layer 28. At the same time, the conductive portions 64 are formed over the upper surface of the metal supporting layer 67 exposed from the second base openings 61.

That is, as shown in FIG. 1, the conductive layer 19 is formed in a pattern including the wires 25 formed on the insulating base layer 28, and the front-side terminals 26, the rear-side terminals 27, and the piezoelectric-side terminals 40 each continued thereto, while the second base openings 61 are each filled with the conductive portion 64.

The conductive layer 19 and the conductive portions 64 are formed by an additive method, a subtractive method, or the like.

Next, as shown in FIG. 8(d), the insulating cover layer 29 is formed in the foregoing pattern.

Next, as shown in FIG. 9(e), the metal supporting layer 67 is trimmed to form the metal supporting board 18 and the metal pedestal portions 60 in the foregoing pattern.

Specifically, the metal supporting layer 67 is formed into the shapes of the metal supporting board 18 and the metal pedestal portions 60 by, e.g., an etching method such as, e.g., dry etching (e.g., plasma etching) or wet etching (e.g., chemical etching), drilling perforation, laser processing, or the like. Preferably, the metal supporting layer 67 is trimmed by wet etching.

Next, as shown in FIG. 9(f), the insulating base layer 28 exposed from the pedestal opening 34 of each of the metal pedestal portions 60 is partially removed.

The insulating base layer 28 is removed by, e.g., etching, or preferably wet etching or the like.

As a result, the insulating base layer 28 in each of the opening formation regions 4 (see FIG. 9(e)) is removed to form the first upper base opening 37.

At the same time, the lower part of the inner peripheral portion 36 of the insulating base layer 28 is removed to form the first lower base opening 38.

Thus, each of the piezoelectric-side terminals 40 exposed from the first upper base opening 37 and the first lower base opening 38 is formed.

Thereafter, as shown in FIG. 9(g), the plating layer 47 is formed on the surface of each of the front-side terminals 26 (see FIG. 1), the rear-side terminals 27 (see FIG. 1), the piezoelectric-side terminals 40, and the frame conductor 39 by plating such as, e.g., electroless plating or electrolytic plating, or preferably by electrolytic plating.

In this manner, the suspension board with circuit 3 is prepared (produced).

Next, as shown in FIGS. 1 and 2, the prepared suspension board with circuit 3, the support plate 2, and the piezoelectric elements 5 are assembled.

Specifically, the suspension board with circuit 3 is disposed on the upper surface of the support plate 2. That is, as shown in FIG. 1, the suspension board with circuit 3 is fixed to the support plate 2 by means of welding, an adhesive, or the like such that the linear portion 20 of the wiring portion 16 traverses the widthwise middle portion of the plate opening 12, the bent portion 21 thereof is disposed on the one widthwise end portion and front end portion of the rear plate portion 9, and the front portion 15 is disposed on the widthwise middle portion of the load beam portion 8 throughout the front-rear direction of the load beam portion 8. In addition, the suspension board with circuit 3 is fixed to the support plate 2 such that the connecting arms 32 are disposed in the both widthwise end portions of the plate opening 12.

Thereafter, as shown in FIG. 3, each of the piezoelectric elements 5 is fixed to the support plate 2, while the electrode 48 of the piezoelectric element 5 is supported on the metal pedestal portion 60.

To fix the piezoelectric element 5 to the support plate 2, the adhesive layers 31 are disposed on the attachment regions 13 of the actuator plate portion 6 and, via the adhesive layers 31, the both end portions of the piezoelectric element 5 in the front-rear direction are attached to the attachment regions 13. As shown in FIG. 1, the piezoelectric elements 5 are disposed in the plate opening 12 and on the both widthwise outsides of the linear portion 20 of the suspension board with circuit 3 to be spaced apart therefrom.

Also, to cause the electrode 48 of the piezoelectric element 5 to be supported on the metal pedestal portion 60, as shown in FIG. 3, the conductive adhesive 42 is provided in each of the pedestal openings 34 and the first lower base openings 38.

The conductive adhesive 42 is, e.g., a connecting medium (a conductive paste such as a gold paste or silver paste) which exhibits an adhesive action by being heated at a relatively low temperature (in a range of, e.g., 100 to 200° C.).

The amount of the conductive adhesive 42 is set to allow the conductive adhesive 42 to fill the pedestal openings 34 and the first lower base openings 38, overflow from the pedestal openings 34, and cover at least the lower surfaces of the metal pedestal portions 60. That is, the amount of the conductive adhesive 42 is set larger than the total volume of the pedestal openings 34 and the first lower base openings 38. The amount of the conductive adhesive 42 is in a range of, e.g., 110 to 1000%, or preferably 300 to 800% of, e.g., the total volume of the pedestal openings 34 and the first lower base openings 38.

The conductive adhesive 42 fills the pedestal openings 34 and the first lower base openings 38, and is also provided on the lower surface of the metal pedestal portion 60. With the conductive adhesive 42, the electrode 48 of each of the piezoelectric elements 5 comes in contact.

The piezoelectric-side terminal 40 and the metal pedestal portion 60 adhere to the electrode 48 via the conductive adhesive 42.

Thus, the electrode 48 is caused to be supported on the metal pedestal portion 60.

Consequently, as shown in FIG. 4, the piezoelectric-side terminal 40 is electrically connected to the electrode 48 via the plating layer 47 and the conductive adhesive 42, while the one end portion 62 of the power source wire 25B is electrically connected to the electrode 48 via the conductive portion 64, the metal pedestal portion 60, and the conductive adhesive 42.

In addition, as shown in FIGS. 1 and 2, the slider 22 mounting the magnetic head (not shown) thereon is mounted on the gimbal 23 to electrically connect the magnetic head (not shown) and the front-side terminals 26.

Moreover, the read/write board (not shown) is electrically connected to the external terminals 27A, and the power source (not shown) is electrically connected to the power-source-side terminals 27B.

Furthermore, the drive coil (not shown) is attached to the base plate portion 7.

In this manner, the assembly 1 is obtained. The assembly 1 is mounted in the hard disk drive (not shown).

In the hard disk drive, the slider 22 of the assembly 1 circumferentially travels relative to a rotating hard disk in the form of a circular plate, while being floated over the surface of the hard disk with a minute gap being held therebetween. Meanwhile, the magnetic head (not shown) of the assembly 1 reads/writes information, while moving in the radial direction of the hard disk based on driving by the drive coil.

In addition, by the extension/contraction of the piezoelectric elements 5, the position of the magnetic head relative to the hard disk drive is accurately and finely adjusted.

That is, electricity is supplied from the power source (not shown) to one of the piezoelectric elements 5 via the power-source-side terminal 27B, the power-source wire 25B, the conductive portion 64, the piezoelectric-side terminal 40, and the metal pedestal portion 60 and the voltage thereof is controlled so that the piezoelectric element 5 contracts. As a result, the front end portion of the rear plate portion 9 and the rear end portion of the front plate portion 10 in one widthwise end portion come closer to each other, while being flexibly supported on the flexible portion 11.

At the same time, electricity is supplied from the power source (not shown) to the other piezoelectric element 5 via the power-source-side terminal 27B, the power-source wire 25B, the conductive portion 64, the piezoelectric-side terminal 40, and the metal pedestal portion 60 and the voltage thereof is controlled so that the piezoelectric element 5 extends. As a result, the front end portion of the rear plate portion 9 and the rear end portion of the front plate portion 10 in the other widthwise end portion go farther away from each other, while being flexibly supported on the flexible portion 11.

Consequently, the front plate portion 10 and the load beam portion 8 swing around the widthwise middle point of the front end portion of the rear plate portion 9 toward one widthwise side. At the same time, the suspension board with circuit 3 and the slider 22 which are fixed to the load beam portion 8 swing toward one widthwise side.

On the other hand, when one of the piezoelectric elements 5 is extended and the other piezoelectric element 5 is contracted, the front plate portion 10 and the load beam portion 8 swing in a direction opposite to the direction described above.

In the suspension board with circuit 3, by providing each of the piezoelectric-side terminals 40 with the conductive adhesive 42, the conductive adhesive 42 is electrically connected to the piezoelectric-side terminal 40.

On the other hand, the metal pedestal portion 60 is electrically connected to the power source wire 25B via the conductive portion 64.

In addition, by causing each of the piezoelectric elements 5 to be supported on the metal pedestal portion 60, the electrode 48 of the piezoelectric element 5 can be electrically connected to the piezoelectric-side terminal 40 via the conductive adhesive 42 and can also be electrically connected to the power source wire 25B via the metal pedestal portion 60 and the conductive portion 64.

Therefore, it is possible to improve the reliability of the electrical connection between the electrode 48 of the piezoelectric element 5 and the conductive layer 19.

Note that, in the embodiment shown by the solid line in FIG. 5, in each of the pad portions 33, the plating layer 47 is provided on the surface of the piezoelectric-side terminal 40. However, as shown by, e.g., the phantom line of FIG. 5, the plating layer 47 can also be provided on the surface of the metal pedestal portion 60.

In FIG. 5, the plating layer 47 in the metal pedestal portion 60 is formed on the entire surface of the metal pedestal portion 60. Specifically, the plating layer 47 in the metal pedestal portion 60 is formed continuously to the lower surface, inner surface, and outer surface of the metal pedestal portion 60.

The embodiment shown by the phantom line in FIG. 5 can achieve the same operation and function as achieved by the embodiment shown by the solid line in FIG. 5. In addition, the embodiment shown by the phantom line in FIG. 5 can also suppress discoloration and corrosion of each of the metal pedestal portions 60 by means of the plating layer 47 provided also on the surface of the metal pedestal portion 60 and thereby improve the reliability of electrical connection between the conductive adhesive 42 (see FIG. 4) and the metal pedestal portion 60.

Also, in the embodiments of FIG. 5, the plating layer 47 is provided on the surface of each of the piezoelectric-side terminals 40. However, it is also possible to expose the surface of the piezoelectric-side terminal without providing the plating layer 47 on the surface of the piezoelectric-side terminal 40, though not shown.

Preferably, as in the embodiments shown by the solid line and the phantom line in FIG. 5, the plating layer 47 is provided on the surface of each of the piezoelectric-side terminals 40. This can suppress discoloration and corrosion of each of the piezoelectric-side terminals 40 and thereby improve the reliability of electrical connection between the conductive adhesive 42 (see FIG. 4) and the piezoelectric-side terminal 40.

In the embodiment of each of FIGS. 6 and 7, each of the metal pedestal portions 60 is formed in a generally drop-like shape. However, the shape thereof is not particularly limited as long as the shape is in the form of a frame which can ensure a region overlapping the conductive portion 64. The metal pedestal portion 60 can also be formed into a generally annular (ring) shape or a generally quadrilateral frame shape, though not shown.

Figure 10:
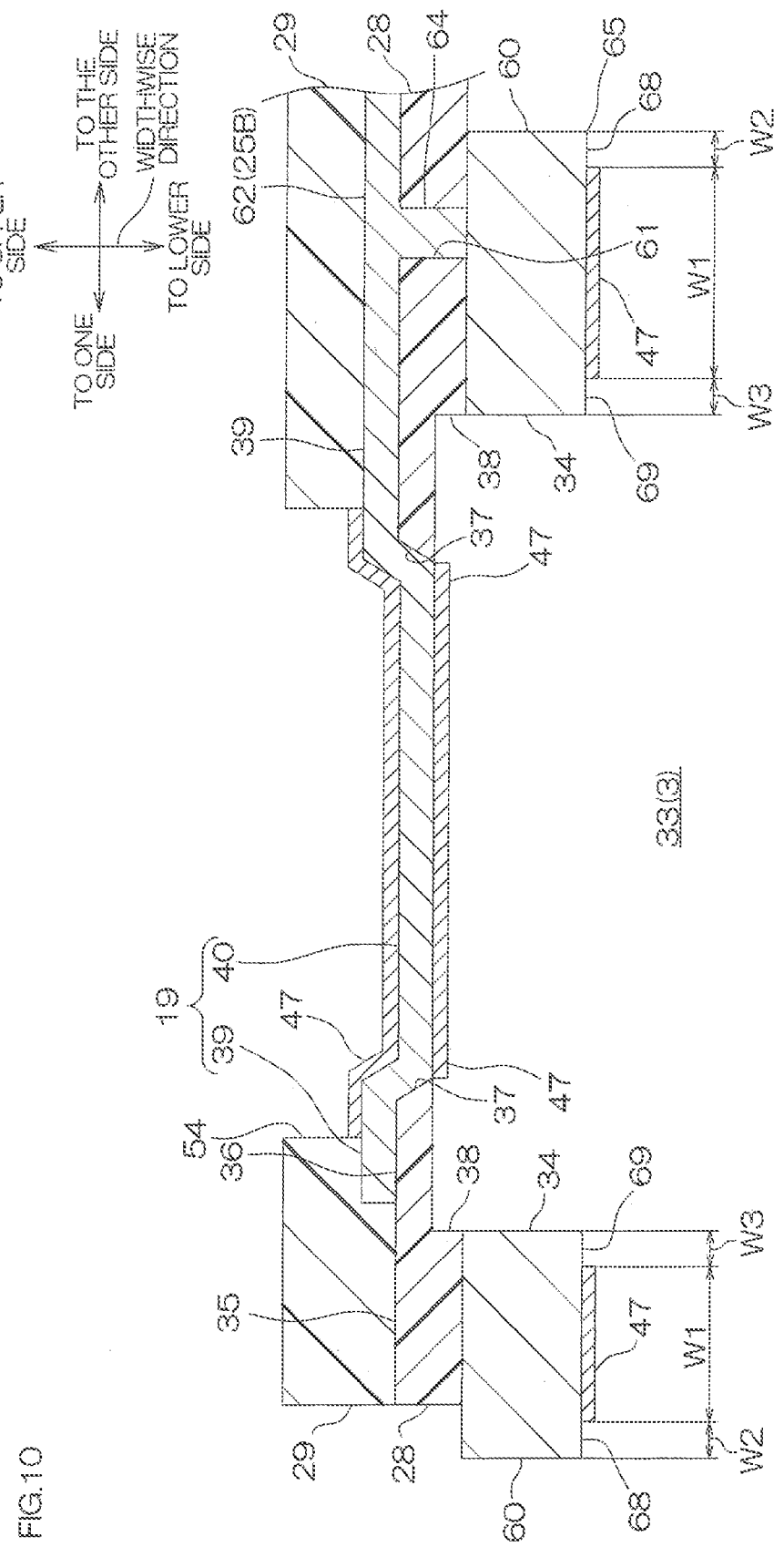
FIG. 10 shows an enlarged cross-sectional view of a pad portion of an assembly including a suspension board with circuit as another embodiment of the wired circuit board of the present invention.

FIG. 10 shows an enlarged cross-sectional view of a pad portion of an assembly including a suspension board with circuit as another embodiment of the wired circuit board of the present invention. FIGS. 11 and 12 are process views illustrating a producing method of the suspension board with circuit shown in FIG. 10.

Note that the members corresponding to the individual components described above are designated by the same reference numerals in each of the subsequent drawings, and a detailed description thereof is omitted.

In the embodiment shown by the phantom line of FIG. 5, the plating layer 47 is formed on the entire surface of each of the metal pedestal portions 60. However, as shown in FIG. 10, the plating layer 47 may also be provided on, e.g., a part of the surface of each of the metal pedestal portions 60.

In FIG. 10, the plating layer 47 on the metal pedestal portion 60 is formed on a part of the lower surface of the metal pedestal portion 60. Specifically, the plating layer 47 is formed in a generally drop-shaped pattern exposing the outer end portion and inner end portion of the lower surface of the metal pedestal portion 60. That is, the plating layer 47 is included in the metal pedestal portion 60 such that the outer end portion thereof is located inwardly of the outer end portion of the metal pedestal portion 60 and the inner end portion thereof is located outwardly of the inner end portion of the metal pedestal portion 60.

A width W1 of the plating layer 47 is in a range of, e.g., 20 to 190 µm, preferably 25 to 140 µm, or more preferably 30 to 110 µm. A width W2 of an outer exposed portion 68 of the metal pedestal portion 60 located outwardly of the plating layer 47 and a width W3 of an inner exposed portion 69 of the metal pedestal portion 60 located inwardly of the plating layer 47 are in a range of, e.g., 5 to 30 µm, preferably 5 to 25 µm, or more preferably 5 to 20 µm.

Next, a method of preparing (producing) the suspension board with circuit 3 shown in FIG. 10 is described with reference to FIGS. 11 and 12.

In the method, as shown in FIG. 11(a), the metal supporting layer 67 is prepared first.

Next, as shown in FIG. 11(b), the insulating base layer 28 is formed in the foregoing pattern on the metal supporting layer 67.

Next, as shown in FIG. 11(c), the conductive layer 19 is formed on the upper surface of the insulating base layer 28. At the same time, the conductive portion 64 is formed on the upper surface of the metal supporting layer 67 exposed from each of the second base openings 61.

Next, as shown in FIG. 11(d), the insulating cover layer 29 is formed in the foregoing pattern.

Next, as shown in FIG. 12(e), the plating layer 47 is formed in the foregoing pattern on the lower surface of the metal supporting layer 67.

Specifically, the plating layer 47 is formed first on the entire lower surface of the metal supporting layer 67 by plating (not shown). Thereafter, by etching or the like, the portion other than the foregoing pattern is removed to form the plating layer 47 into the foregoing pattern.

Alternatively, a plating resist (not shown) is laminated on the lower surface of the metal supporting layer 67 into a pattern reverse to the foregoing pattern. Thereafter, the plating layer 47 is formed by plating on the lower surface of the metal supporting layer 67 exposed from the plating resist, and then the plating resist is removed.

Next, as shown in FIG. 12(f), the metal supporting layer 67 is trimmed to form the metal supporting board 18 and the metal pedestal portions 60 in the foregoing pattern.

Next, as shown in FIG. 12(h), the insulating base layer 28 exposed from the pedestal opening 34 of each of the metal pedestal portions 60 is partially removed. Consequently, the insulating base layer 28 in each of the opening formation regions 4 (see FIG. 12(f)) is removed to form the first upper base opening 37. At the same time, the lower part of the inner peripheral portion 36 of the insulating base layer 28 is removed to form the first lower base opening 38.

Thus, each of the piezoelectric-side terminals 40 exposed from the first upper base opening 37 and the first lower base opening 38 is formed.

Thereafter, as shown in FIG. 12(h), the plating layer 47 is formed on the surface of each of the front-side terminals 26 (see FIG. 1), the rear-side terminals 27 (see FIG. 1), the piezoelectric-side terminals 40, and the frame conductor 39.

In this manner, the suspension board with circuit 3 is prepared (produced).

The embodiment of FIG. 10 can achieve the same operation and function achieved by the embodiment shown by the phantom line in FIG. 5.

EXAMPLES

While in the following, the present invention is described more specifically with reference to Examples and Comparative Example, the present invention is by no means limited thereto.

Example 1

First, a metal supporting layer made of a stainless steel having a thickness of 18 µm was prepared (see FIG. 8(*a*)).

Then, an insulating base layer made of a polyimide resin was formed on the metal supporting layer into a pattern formed with circular opening formation regions and circular second base openings (see FIG. 8(*b*)). The inner diameter of each of the opening formation regions was 200 µm and the thickness thereof was 3 µm. The thickness of the second insulating base layer around the opening formation region was 10 µm and the inner diameter of each of the second base openings was 60 µm. The distance between the second base opening and the opening formation region was 65 µm.

Then, by an additive method, a conductive layer made of copper and having a thickness of 10 µm was formed on the upper surface of the insulating base layer, and the second base openings were each filled with a conductive portion (see FIG. 8(*c*)).

Then, an insulating cover layer made of a polyimide resin and having a thickness of 4 µm was formed in the foregoing pattern formed with circular cover openings each having an inner diameter of 200 µm (see FIG. 8(*d*)).

Then, by wet etching, the metal supporting layer was trimmed to form a metal supporting board and metal pedestal portions in the foregoing pattern (see FIG. 9(*e*)).

Each of the metal pedestal portions was in the form of a drop-shaped frame, and the protruding portion thereof included the second base opening (conductive portion) when viewed in bottom view. In the middle of the metal pedestal portion, a circular pedestal opening having an inner diameter of 280 µm was formed. The width (distance between the outer peripheral surface of the metal pedestal portion and the inner peripheral surface of the pedestal opening) of the metal pedestal portion was 100 µm.

Then, the insulating base layer exposed from the pedestal opening of the metal pedestal portion was partially removed by wet etching (see FIG. 9(*f*)).

Consequently, the insulating base layer in each of the opening formation regions was removed to form a first upper base opening, while the lower part of the inner peripheral portion of the insulating base layer was removed simultaneously to form a first lower base opening.

The first upper base opening had a circular shape and an inner diameter of 200 µm. The first lower base opening had a circular shape including the first upper base opening and an inner diameter of 280 µm.

Thereafter, by electroless plating, a plating layer made of gold and having a thickness of 1.0 µm was formed on the surface of each of front-side terminals, rear-side terminals, piezoelectric-side terminals, and a frame conductor (see FIG. 9(*g*)).

In this manner, a suspension board with circuit was produced.

Example 2

A suspension board with circuit was produced by performing the same process as performed in Example 1 except that the plating layer was provided also on the surface of each of the metal pedestal portions (see the phantom line in FIG. 5).

Comparative Example 1

A suspension board with circuit was produced by performing the same process as performed in Example 1 except that, in the formation of the insulating base layer, the second base openings were not formed and, in the formation of the conductive layer, the conductive portions were not provided.

(Evaluation)

On the piezoelectric-side terminals of Examples 1 and 2 and Comparative Example 1, a gold paste was provided in amounts larger than in the pedestal openings and the first lower base openings to produce samples. Then, the samples were heated at 150° C. for 30 minutes.

Electric resistances between copper foils and conductive layers were measured before and after heating.

The result thereof is shown in Table 1.

TABLE 1

|  |  | Ex. 1 | Ex. 2 | Comp. Ex. 1 |
|---|---|---|---|---|
| Resistance (Ω) | Before Test | 0.5 | 0.5 | 1.5 |
|  | After Test | 0.6 | 0.5 | 2.4 |

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board, comprising:
  an insulating layer formed with a first opening and a second opening arranged to be spaced apart from each other and extend through the insulating layer in a thickness direction;
  a conductive layer formed on the insulating layer and including a terminal overlapping the first opening when projected in the thickness direction, and a wire having a part thereof overlapping the second opening when projected in the thickness direction and continued to the terminal;
  a metal pedestal portion formed under the insulating layer and disposed around the first opening so as to overlap the second opening when projected in the thickness direction and support an electronic element; and
  a conductive portion filling the second opening to provide electrical conduction between the wire and the metal pedestal portion.

2. A wired circuit board according to claim 1, wherein the terminal is used to be connected to the electronic element via a conductive adhesive.

3. A wired circuit board according to claim 1, further comprising:
  a plating layer formed on a surface of the terminal.

4. A wired circuit board according to claim 1, further comprising:
  a plating layer formed on a surface of the terminal and on a surface of the metal pedestal portion.

* * * * *